(12) United States Patent
Masood et al.

(10) Patent No.: US 9,041,011 B2
(45) Date of Patent: May 26, 2015

(54) MODULAR POWER CONVERTER HAVING REDUCED SWITCHING LOSS

(71) Applicant: International Rectifier Corporation, El Segundo, CA (US)

(72) Inventors: Ahmed Masood, Redondo Beach, CA (US); Hongying Helen Ding, Hermosa Beach, CA (US); Dong Wang, El Segundo, CA (US)

(73) Assignee: International Rectifier Corporation, Segundo, CA (US)

( * ) Notice: Subject to any disclaimer, the term of this patent is extended or adjusted under 35 U.S.C. 154(b) by 0 days.

(21) Appl. No.: 13/934,579

(22) Filed: Jul. 3, 2013

(65) Prior Publication Data

US 2014/0021487 A1    Jan. 23, 2014

Related U.S. Application Data

(60) Provisional application No. 61/674,531, filed on Jul. 23, 2012.

(51) Int. Cl.
| | |
|---|---|
| *H01L 31/0312* | (2006.01) |
| *H01L 27/088* | (2006.01) |
| *H02M 1/08* | (2006.01) |
| *H03K 17/10* | (2006.01) |
| *H02M 1/00* | (2006.01) |

(52) U.S. Cl.
CPC ............ *H01L 27/088* (2013.01); *H02M 1/08* (2013.01); *H02M 2001/0054* (2013.01); *H03K 17/102* (2013.01); *H03K 2217/0036* (2013.01)

(58) Field of Classification Search
USPC ..................... 257/77, 194; 323/311
See application file for complete search history.

(56) References Cited

U.S. PATENT DOCUMENTS

| | | | | |
|---|---|---|---|---|
| 7,579,862 | B2* | 8/2009 | Bales | 326/30 |
| 2009/0290395 | A1* | 11/2009 | Osaka | 363/126 |
| 2011/0037449 | A1* | 2/2011 | Uno et al. | 323/311 |
| 2011/0181255 | A1* | 7/2011 | Hashimoto et al. | 323/272 |
| 2011/0285302 | A1* | 11/2011 | Choutov et al. | 315/207 |
| 2012/0014148 | A1* | 1/2012 | Li et al. | 363/78 |
| 2012/0139639 | A1* | 6/2012 | Scott et al. | 330/293 |
| 2012/0256188 | A1* | 10/2012 | McDonald et al. | 257/76 |

* cited by examiner

*Primary Examiner* — Phuc Dang
(74) *Attorney, Agent, or Firm* — Farjami & Farjami LLP

(57) ABSTRACT

In one implementation, a modular power converter having a reduced switching loss includes a package, a field-effect transistor (FET) including a gate terminal, a drain terminal, and a source terminal, and fabricated on a semiconductor die situated inside the package, and a driver circuit inside the package. The driver circuit is configured to drive the gate terminal of the FET. The driver circuit is further configured to sample a drain-to-source voltage ($V_{DS}$) of the FET directly from the drain terminal and the source terminal, thereby enabling the reduced switching loss.

11 Claims, 5 Drawing Sheets

MODULAR POWER CONVERTER HAVING REDUCED SWITCHING LOSS

The present application claims the benefit of and priority to a provisional application entitled "Synchronous Rectifier with High Speed Switch," Ser. No. 61/674,531 filed on Jul. 23, 2012. The disclosure in this provisional application is hereby incorporated fully by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_x In_y Ga_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium.

Also as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

II. Background Art

Switching power converters, such as synchronous rectifiers, advantageously offer relatively high efficiency and low power dissipation. Due to these advantages, synchronous rectifiers may be implemented in power conversion applications for which efficiency is a priority.

Despite their relatively high efficiency, switching power converters can be susceptible to switching losses. For example, a conventional approach to implementing a synchronous rectifier typically utilizes a switching circuit and a driver circuit packaged separately from the switching circuit. Control of the switching circuit may rely on sensing, by the driver circuit, of the drain-to-source voltage of a rectifying switch used in the switching circuit. Due to the typically small $R_{DS\_ON}$ of rectifier switches, even a relatively small package lead inductance can result in a significant switching loss.

In addition, switching loss may take the form of reverse recovery loss by the body diode of the rectifying switch. The higher the switching frequency and the greater the rate of change of current with respect to time through the rectifier switch, the larger the power loss during reverse recovery by the rectifying switch. As the switching frequencies of power converters increase, switching losses resulting from parasitic inductances and rectifier switch reverse recovery become of greater concern.

SUMMARY

The present disclosure is directed to a modular power converter having reduced switching loss, substantially as shown in and/or described in connection with at least one of the figures, and as set forth more completely in the claims.

DETAILED DESCRIPTION

Figure 1:
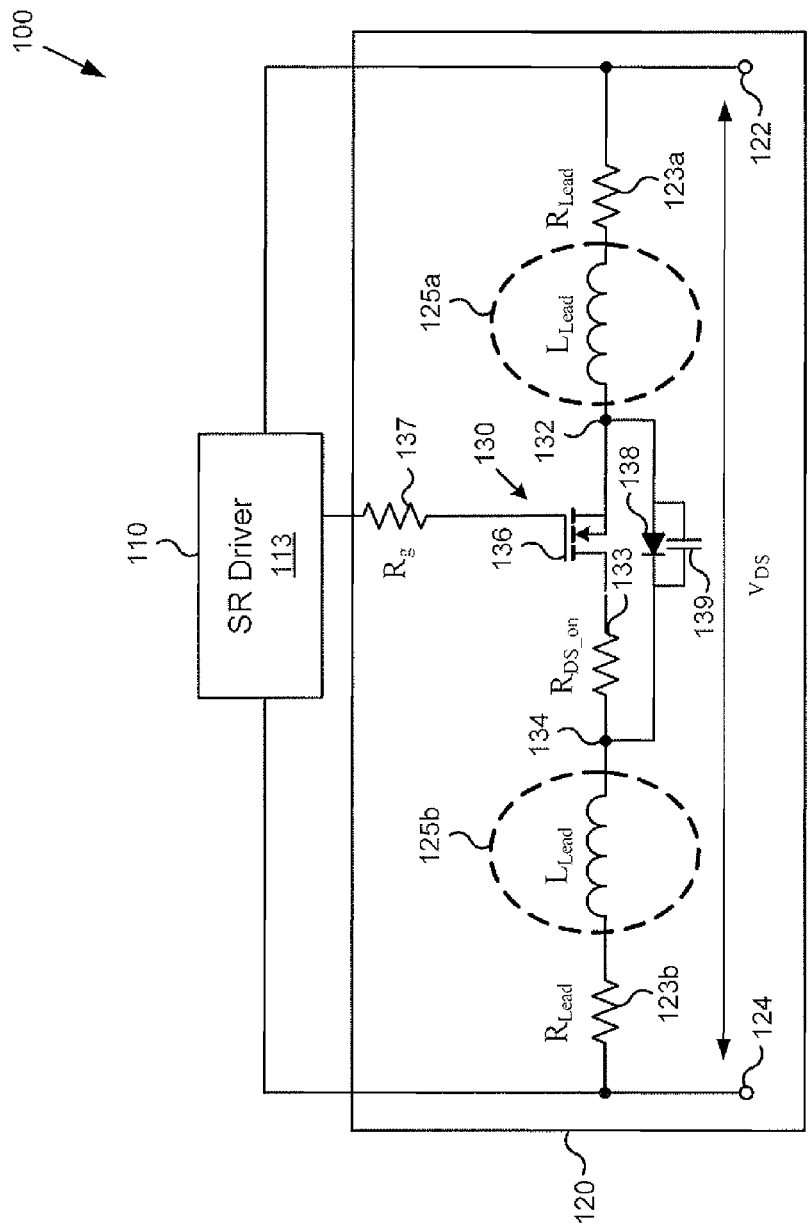
FIG. 1 shows an equivalent circuit of a conventional synchronous rectifier including a driver circuit and a rectifier switch.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As noted above, switching power converters advantageously offer high efficiency and low power dissipation. An example implementation of a switching power converter is the synchronous rectifier, in which active switches, typically in the form of transistors, replace the diodes traditionally relied upon for rectification. Due to their higher efficiency, synchronous rectifiers may be implemented in a variety of power conversion applications that are particularly sensitive to power dissipation. Examples of such applications include resonant converters and power factor correction (PFC) converters, including power converters used in industrial, lighting, and appliance applications.

As further noted above, however, despite their relatively high efficiency, switching power converters can be susceptible to switching loss. Switching loss may take several forms. For example, switching loss may include losses resulting from parasitic capacitances and or inductances produced by package leads. In addition, switching loss may include reverse recovery loss due to negative current flow through the body diode of a rectifying switch when the body diode is taken from forward to reverse bias.

The present application discloses a modular power converter having an integrated design to optimize performance by minimizing switching loss. In one implementation, a modular power converter according to the present inventive concepts unites switching control circuitry and a fast rectifying switch in a single package, thereby advantageously minimizing parasitic inductances and capacitances. As a result, implementations of the present inventive concepts provide a modular power converter having a reduced switching loss. Moreover, the fast rectifier switch may be implemented using a heterojunction field-effect transistor (also referred to as a heterojunction FET or a HEFT), such as a high electron mobility transistor (HEMT), for example, and may thereby further reduce switching loss by reducing reverse recovery loss.

It is noted that in the interests of conceptual clarity, the present description will focus on a specific implementation of a modular power converter, represented as an integrated synchronous rectifier utilizing a fast composite switch including a silicon based FET coupled to a gallium nitride (GaN) based FET. However, it is emphasized that such an implementation is merely exemplary, and the inventive principles disclosed herein are broadly applicable to a wide range of power conversion applications implemented using group IV and/or group III-V semiconductor devices.

FIG. 1 shows an equivalent circuit of a conventional synchronous rectifier including a driver circuit and a rectifier switch. Conventional synchronous rectifier 100 includes driver package 110 including driver circuit 113, and rectifier switch package 120 containing rectifier switch 130. As shown in FIG. 1, rectifier switch 130, which is depicted as an n-channel MOSFET (NMOSFET) includes source 132, drain 134, gate 136, and body diode 138, and has parasitic capacitance 139, gate resistance 137, and $R_{DS\_ON}$ 133.

Also shown in FIG. 1 are switch package source contact 122, switch package drain contact 124, switch package lead resistances 123a and 123b, and switch package lead inductances 125a and 125b. As further shown in FIG. 1, in the conventional implementation, driver circuit 113 senses the drain-to-source voltage ($V_{DS}$) of rectifier switch 130 between switch package source contact 122 and switch package drain contact 124.

For synchronous rectifiers using $V_{DS}$ sensing, as shown in FIG. 1, a typical design challenge is the switching loss caused by switch package lead inductances 125a and 125b. As shown in FIG. 1, in conventional implementations, the sensed $V_{DS}$ of rectifier switch 130 is actually the sum of the voltage drop across $R_{DS\_ON}$ 133, the inductive voltage drop across switch package lead inductances 125a and 125b, and the voltage drop across each of switch package lead resistances 123a and 123b. Due to the typically small $R_{DS\_ON}$ 133 of rectifier switch 130, a switch package lead inductance of approximately one nanohenry (1.0 nH) can cause a significant switching loss. In addition, suboptimal printed circuit board (PCB) layout can further increase the switching loss. The switching loss produced by PCB layout issues and switch package lead inductances 125a and 125b can also introduce additional conduction loss by body diode 138 of rectifier switch 130, thereby further increasing switching loss.

Switching loss is also produced as reverse recovery loss by body diode 138 of rectifier switch 130. The higher the switching frequency and the greater the rate of change of current with respect to time (di/dt) through rectifier switch 130, the larger the power loss produced during reverse recovery. As the switching frequencies of power converters increase, switching losses resulting from package parasitics and rectifier switch reverse recovery pose an increasingly significant problem. For example, switching loss is especially of concern for continuous conduction mode (CCM) applications, such as synchronous rectification, in which current flow is substantially continuous.

Figure 2:
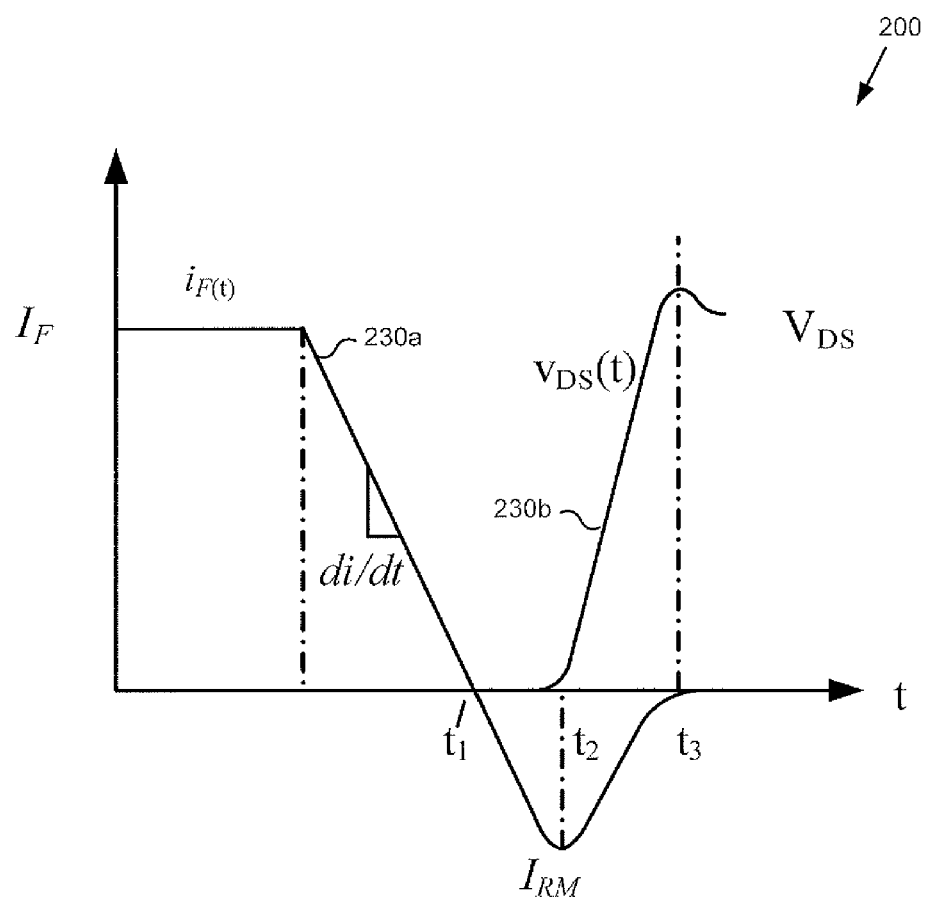
FIG. 2 is a graph showing a trace representing the current through the rectifier switch body diode shown in FIG. 1, and another trace representing the drain-to-source voltage ($V_{DS}$) of the rectifier switch, both as a function of time.

During synchronous rectifier operation, conduction by body diode 138 of rectifier switch 130 occurs because synchronous rectifier switch 130 is turned off before commutation of the current, as known in the art. A typical reverse recovery transition produced by the conventional synchronous rectifier implementation of FIG. 1 is shown in FIG. 2. FIG. 2 shows graph 200 of trace 230a representing the current through body diode 138 of rectifier switch 130 as a function of time, and trace 230b representing the $V_{DS}$ of rectifier switch 130 as a function of time. As shown by FIG. 2, body diode 138 of rectifier switch 130 continues to conduct between times $t_1$ and $t_3$, resulting in a maximum reverse current ($I_{RM}$) at time $t_2$. The reverse recovery loss of rectifier switch 130 occurs during the time interval $t_2$-$t_3$ because of the overlap of current trace 230a and $V_{DS}$ trace 230b in that interval.

Referring back to FIG. 1, it is reiterated that switch package lead inductances 125a and 125b are significant contributors to switching loss by rectifier switch 130. Moreover, because the impedances presented by switch package lead inductances 125a and 125b are a function of the switching frequency, the switch package lead inductance caused switching loss is also affected by the switching frequency. That is to say, with substantially unchanged values for $R_{DS\_ON}$ 133 and switch package lead inductances 125a and 125b, the higher the switching frequency, the greater the switching loss becomes. Furthermore, for high frequency applications, and in particular for CCM applications, the reverse recovery loss of body diode 138 is also significant. Thus, the higher the switching frequency, the greater the impact of the reverse recover loss on total power loss.

Figure 3:
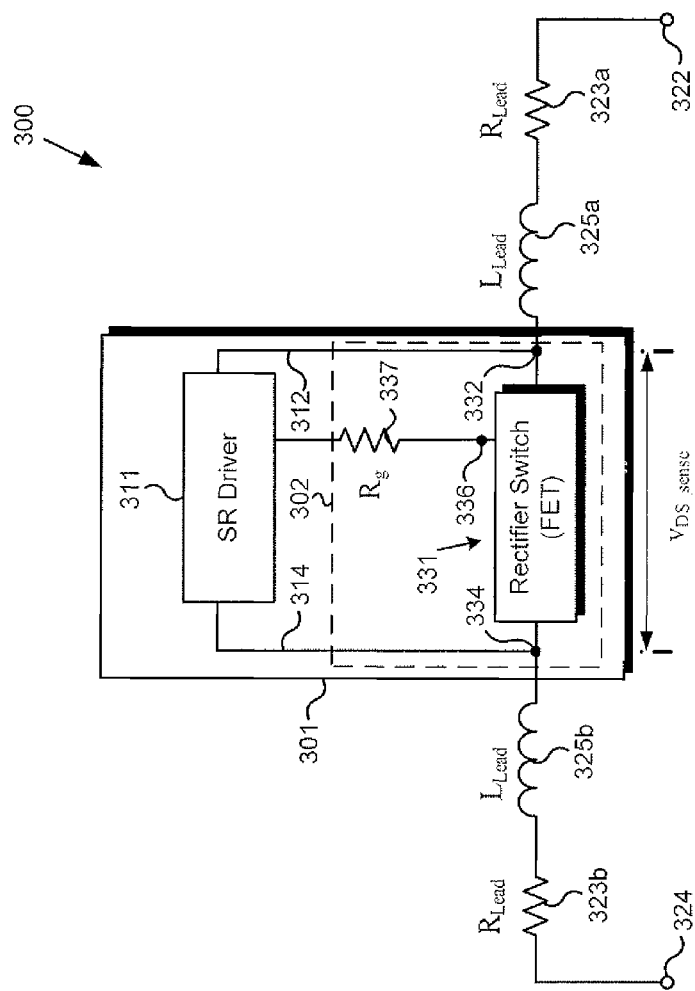
FIG. 3 shows an equivalent circuit of one exemplary implementation of a modular power converter having reduced switching loss.

Moving to FIG. 3, FIG. 3 shows an equivalent circuit of one exemplary implementation of a modular power converter having reduced switching loss. Modular power converter 300 is depicted as a synchronous rectifier including driver circuit 311 and fast rectifier switch 331. It is reiterated that the depiction of features shown by FIG. 3 is provided for conceptual clarity and is not intended to correspond to actual relative dimensions, or to limit the scope of the concepts represented by FIG. 3. For example, although shown as a synchronous rectifier in FIG. 3, in other implementations, modular power converter 300 may correspond to any power converter configured for use in a CCM power application.

Unlike conventional synchronous rectifier 100, shown in FIG. 1, modular power converter 300 including driver circuit 311 and fast rectifier switch 331, in FIG. 3, is implemented in a single integrated module or package 301. Fast rectifier switch 331, which may be implemented as a composite FET, for example, is fabricated on semiconductor die 302 situated inside module or package 301. Fast rectifier switch 331 (hereinafter "FET 331") includes source terminal 332, drain terminal 334, and gate terminal 336. Due in part to its fast switching speed, FET 331 is configured to have a reduced reverse recovery loss compared with conventional rectifier switch 130, in FIG. 1. As shown by FIG. 3, driver circuit 311 is also situated inside module or package 301 and is configured to drive gate terminal 336 of FET 331. It is noted that although in some implementations, FET 331 may be a composite FET, in other implementations, FET 331 can be implemented using a single type of fast transistor, such as a silicon carbide (SiC) on silicon (Si) FET, for example.

In some implementations, driver circuit 311 and FET 331 can be implemented as part of an integrated circuit (IC). In those implementations, both driver circuit 311 and FET 331 may be fabricated on the same semiconductor die, such as semiconductor die 302. Also shown in FIG. 3 are external module or package source contact 322, external module or package drain contact 324, module or package lead resistances 323a and 323b, module or package lead inductances 325a and 325b, and gate resistance 337 of FET 331.

According to the implementation shown in FIG. 3, the $V_{DS}$ of FET 331 can be sampled directly from drain terminal 334 and source terminal 332 on semiconductor die 302. For example, in one implementation, driver circuit 311 is Kelvin connected to drain terminal 334 and source terminal 332 of FET 331. That is to say, the $V_{DS}$ of FET 331 can be sensed using an on-chip Kelvin connection, i.e., a connection, such as a four terminal or "four wire" connection separating the current path through the component being sensed from the voltage drop across the component, as known in the art. The sensed $V_{DS}$ can be fed to driver circuit 311 using connections 312 and 314, as shown in FIG. 3. Thus, the sensed $V_{DS}$ of FET 331 is substantially unaffected by the inductive voltage drops across module or package lead inductances 325a and 325b or the voltage drops across module or package lead resistances 323a and 323b. In addition, the gate drive signal generated by driver circuit 311 can be fed to gate terminal 336 of FET 331 through gate resistance 337 without external parasitic influences.

Figure 4:
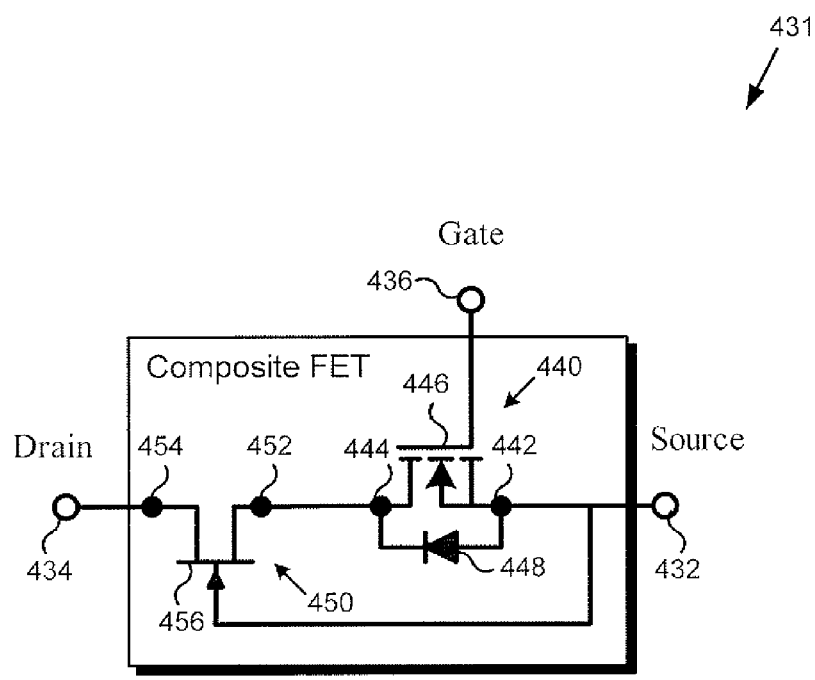
FIG. 4 shows an exemplary implementation of a composite switch suitable for use as the rectifier switch in the modular power converter represented in FIG. 3.

FIG. 4 shows an exemplary implementation of a composite FET suitable for use as FET 331 of modular power converter 300, in FIG. 3. Composite FET 431, in FIG. 4, includes low side group IV FET 440, including source 442, drain 444, gate 446, and body diode 448, and high side group III-V FET 450 including source 452, drain 454, and gate 456. In some implementations, for example, group IV FET 440 may be a silicon FET, and group III-V FET 450 may be a III-Nitride FET.

According to the implementation in FIG. 4, source 452 of group III-V FET 450 is coupled to drain 444 of group IV FET 440, drain 454 of group III-V FET 450 provides drain terminal 434 for composite FET 431, gate 446 of group IV FET 440 provides gate terminal 436 for composite FET 431, and source 442 of group IV FET 440 provides source terminal 432 for composite FET 431. In addition, gate 456 of group III-V FET 450 is coupled to source 442 of group IV FET 440. In one implementation, FET 450 may be implemented as a depletion mode (normally on) switch, while composite FET 431 operates as an enhancement mode (normally off) switch.

It is noted that due to the coupling of group IV FET 440 and group III-V FET 450 shown in the implementation of FIG. 4, a lower voltage rating FET, i.e., a FET having a lower gate-to-source voltage, can be used as group IV FET 440 than may be the case for the conventional implementation shown in FIG. 1. In other words, group IV FET 440, in FIG. 4, may be a lower voltage FET than the FET used to implement rectifier switch 130, in FIG. 1. For example, the gate-to-source voltage for group IV FET 440 may be in a range from approximately two volts to approximately four volts (2-4 V), while the gate-to-source voltage for conventional rectifier switch 130 may range up to approximately ten volts (10 V). In addition, the coupling of group III-V FET 450 and group IV FET 440 shown in FIG. 4 results in a reduced reverse recovery current in composite FET 431, as will be described in greater detail below by reference to FIG. 5.

In other implementations, for example, group III-V FET 450 may be implemented as a GaN or other III-Nitride transistor, such as an insulated-gate FET (IGFET) or an HFET. In one implementation, when configured as an HFET, group III-V FET 450 may be a HEMT configured to produce a two-dimensional electron gas (2DEG).

Figure 5:
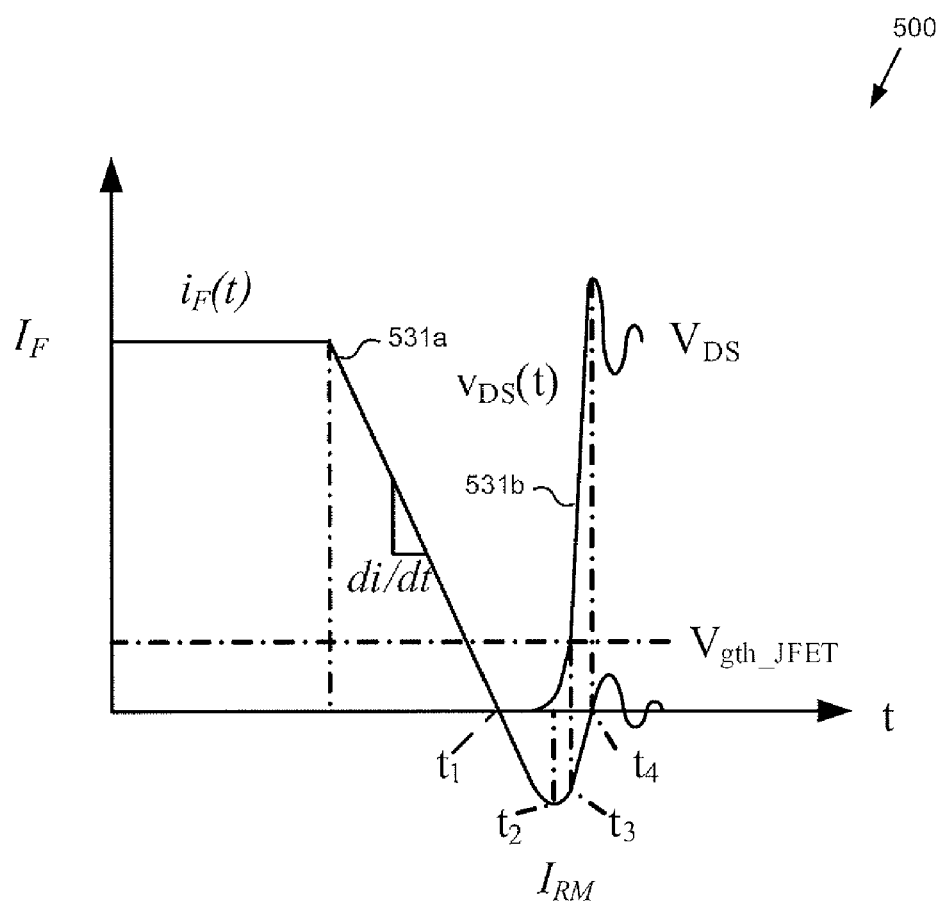
FIG. 5 is a graph showing a trace representing the current through a body diode of the composite switch shown in FIG. 4, and another trace representing the $V_{DS}$ of that composite switch, both as a function of time.

Referring to FIG. 5, FIG. 5 shows a reverse recovery transition for composite FET 431, in FIG. 4. FIG. 5 shows graph 500 of trace 531a representing the current through body diode 448 of group IV FET 440 as a function of time, and trace 531b representing the $V_{DS}$ of composite FET 431 as a function of time. Body diode 448 of group IV FET 440 continues to conduct between times $t_1$ and $t_4$, resulting in a maximum reverse current ($I_{RM}$) at time $t_2$. However, due to the lower voltage rating of group IV FET 440, $I_{RM}$ at time $t_2$ is much smaller than the analogous $I_{RM}$ resulting from the conventional implementation of FIG. 1, shown by graph 200, in FIG. 2. At time $t_3$, in FIG. 5, $V_{DS}$ trace 531b reaches the turn-off threshold of group III-V FET 450. At the same time, the reverse recovery current shown by trace 531a reduces very sharply due to the turn-off of group III-V FET 450. Because the overlap of the current and the voltage is much smaller between time $t_2$ and time $t_4$ than is true for the analogous $t_2$-$t_3$ interval shown by graph 200, the reverse recovery loss is effectively reduced in composite FET 431 when compared to conventional rectifier switch 130, in FIG. 1.

Thus, the present application discloses a modular power converter having reduced switching loss. By integrating a fast rectifier switch, $V_{DS}$ sensing, and driver circuitry into one module or package, the switching loss caused by lead wire parasitics can be significantly reduced. In addition, due to its integrated design, the modular power converter solution disclosed herein is substantially immune to PCB layout caused switching loss. Moreover, the power loss caused by body diode conduction in the fast rectifier switch is also reduced and, consequently, thermal performance and reliability are enhanced. Furthermore, the present solution further results in reduced reverse recovery loss by the fast rectifier switch. Consequently, the present application discloses a power converter solution with enhanced high frequency switching performance across a wide variety of applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A modular power converter having a reduced switching loss, said modular power converter comprising:
   a package;
   a field-effect transistor (FET) including a gate terminal, a drain terminal, and a source terminal fabricated on a semiconductor die situated inside said package;
   a driver circuit inside said package, said driver circuit configured to drive said gate terminal of said FET;
   said driver circuit further configured to sample a drain-to-source voltage ($V_{DS}$) of said FET directly from said drain terminal and said source terminal, thereby enabling said reduced switching loss.

2. The modular power converter of claim 1, wherein said modular power converter is configured for use in a continuous conduction mode (CCM) power application.

3. The modular power converter of claim 1, wherein said driver circuit is Kelvin connected to said drain terminal and said source terminal of said FET.

4. The modular power converter of claim 1, wherein said FET and said driver circuit are part of an integrated circuit (IC) fabricated on said semiconductor die.

5. The modular power converter of claim 1, wherein said modular power converter comprises a synchronous rectifier.

6. The modular power converter of claim 1, wherein said FET is configured to have a reduced reverse recovery loss.

7. The modular power converter of claim 1, wherein said FET is a composite FET comprising a group IV FET and a group III-V FET.

8. The modular power converter of claim 1, wherein said FET is a composite FET comprising a group IV FET and a group III-V FET, said group IV FET coupled to said group III-V FET so as to reduce a reverse recovery current of said composite FET.

9. The modular power converter of claim 1, wherein said FET is a composite FET comprising a silicon FET and a III-Nitride FET.

10. The modular power converter of claim 1, wherein said FET is a composite FET comprising a silicon FET and a III-Nitride high electron mobility transistor (HEMT).

11. The modular power converter of claim 1, wherein said FET comprises a silicon carbide (SiC) on silicon (Si) FET.

* * * * *